United States Patent
Kwak et al.

(10) Patent No.: US 7,151,786 B2
(45) Date of Patent: Dec. 19, 2006

(54) SEMICONDUCTOR LASER DIODE WITH CURRENT RESTRICTING LAYER AND FABRICATION METHOD THEREOF

(75) Inventors: Joon-seop Kwak, Kyungki-do (KR); Kyoung-ho Ha, Seoul (KR); Youn-joon Sung, Kyungki-do (KR)

(73) Assignee: Samsung Electro-Mechanics Co., Ltd., Suwon (KR)

(*) Notice: Subject to any disclaimer, the term of this patent is extended or adjusted under 35 U.S.C. 154(b) by 90 days.

(21) Appl. No.: 10/456,510

(22) Filed: Jun. 9, 2003

(65) Prior Publication Data

US 2004/0013148 A1    Jan. 22, 2004

(30) Foreign Application Priority Data

Jul. 19, 2002    (KR) ............... 2002-42487

(51) Int. Cl.
*H01S 3/19* (2006.01)
*H01S 5/00* (2006.01)

(52) U.S. Cl. ............... 372/46.01; 372/43.01; 372/44.01

(58) Field of Classification Search ........... 372/44–47, 372/43; 438/21, 22
See application file for complete search history.

(56) References Cited

U.S. PATENT DOCUMENTS

| | | | | |
|---|---|---|---|---|
| 5,048,038 A | * | 9/1991 | Brennan et al. ............... 372/46 |
| 5,138,626 A | * | 8/1992 | Yap ............................... 372/46 |
| 5,202,896 A | * | 4/1993 | Taylor ........................... 372/50 |
| 5,465,266 A | * | 11/1995 | Bour et al. .................... 372/46 |
| 5,561,680 A | * | 10/1996 | Haberern et al. ............. 372/46 |
| 5,696,784 A | * | 12/1997 | Srinivasan et al. ........... 372/46 |
| 6,235,617 B1 | | 5/2001 | Kawai | |
| 6,252,894 B1 | * | 6/2001 | Sasanuma et al. ............ 372/45 |
| 6,468,902 B1 | * | 10/2002 | Kawai ......................... 438/667 |
| 6,515,308 B1 | * | 2/2003 | Kneissl et al. ................ 257/86 |

(Continued)

FOREIGN PATENT DOCUMENTS

JP    6232494    8/1994

(Continued)

OTHER PUBLICATIONS

Austin V. Harton et al., "Implantation of Li+ and Na+ into PbTeSe for Current Confinement in PbTeSe/PbSnTe Ridge Waveguide Lasers", Journal of Applied Physics, 1992, pp. 2575-2578, vol. 72, No. 7, American Institute of Physics, New York, New York, USA, Oct. 1992.

(Continued)

*Primary Examiner*—Don Wong
*Assistant Examiner*—Hung Tran Vy
(74) *Attorney, Agent, or Firm*—Buchanan Ingersoll & Rooney PC (57) ABSTRACT

Provided are a semiconductor laser diode having a current confining layer and a method of fabricating the same. The semiconductor laser diode includes a substrate, a first material layer deposited on the substrate, an active layer which is deposited on the first material layer and emits a laser beam, and a second material layer which is deposited on the active layer and includes a ridge portion protruding from the active layer and a current confining layer formed by injection of ions into peripheral portions of the ridge portion so as to confine a current injected into the active layer. Therefore, it is possible to fabricate an improved semiconductor laser diode having a low-resonance critical current value that can remove a loss in an optical profile and reduce the profile width of a current injected into the active layer while maintaining the width of the ridge portion.

32 Claims, 7 Drawing Sheets

U.S. PATENT DOCUMENTS

| | | | |
|---|---|---|---|
| 6,529,541 B1 * | 3/2003 | Ueki et al. | 372/96 |
| 6,650,683 B1 * | 11/2003 | Ueki et al. | 372/96 |
| 6,711,195 B1 * | 3/2004 | Chang et al. | 372/45 |
| 6,852,558 B1 * | 2/2005 | Lee et al. | 438/32 |
| 6,881,601 B1 * | 4/2005 | Sugawara | 438/47 |
| 2002/0177250 A1 * | 11/2002 | Zhu et al. | 438/42 |
| 2003/0007531 A1 * | 1/2003 | Aggerstam | 372/46 |
| 2003/0161369 A1 * | 8/2003 | Chang et al. | 372/45 |

FOREIGN PATENT DOCUMENTS

| | | | |
|---|---|---|---|
| JP | 07-066492 | * | 3/1995 |
| JP | 10-056233 | | 2/1998 |
| JP | 11261105 | * | 9/1999 |
| KR | 10-1997-0068059 | | 10/1997 |
| KR | 10-1998-069644 | | 10/1998 |

OTHER PUBLICATIONS

Notice to Submit Response issued by the Korean Patent Office on Oct. 30, 2004 in corresponding application.

* cited by examiner

FIG. 6B ent invention relates to a semiconductor laser
SEMICONDUCTOR LASER DIODE WITH CURRENT RESTRICTING LAYER AND FABRICATION METHOD THEREOF This application claims the priority of Korean Patent Application No. 2002-42487, filed Jul. 19, 2002 in the Korean Intellectual Property Office, the disclosure of which is incorporated herein in its entirety by reference.

BACKGROUND OF THE INVENTION

1. Field of the Invention

The present invention relates to a semiconductor laser diode and a fabrication method thereof, and more particularly, to a semiconductor laser diode having a ridge wave guide and a fabrication method thereof.

2. Description of the Related Art

A semiconductor laser diode generates a laser beam having frequency of a narrow width and keen directivity and is thus mainly used in a field such as optical communication, a multiple communication and a space communication. Also, the semiconductor laser diode is extensively used for transmission of data or recording and reading of data in a communication field such as an optical communication and an apparatus such as a compact disc player (CDP) and a digital versatile disc player (DVDP).

The extensive use of the semiconductor laser diode is due to facts that the emission characteristics of a laser beam can be maintained in a limited space and the semiconductor laser diode is a compact device and has a small critical current value for emission. An increase in the number of industrial fields adopting the semiconductor laser diode results in an increase in a need for a semiconductor laser diode having a more reduced critical current value. That is, it is required to manufacture an excellent semiconductor laser diode capable of enabling low-current emission and having longer lifetime.

Figure 1:
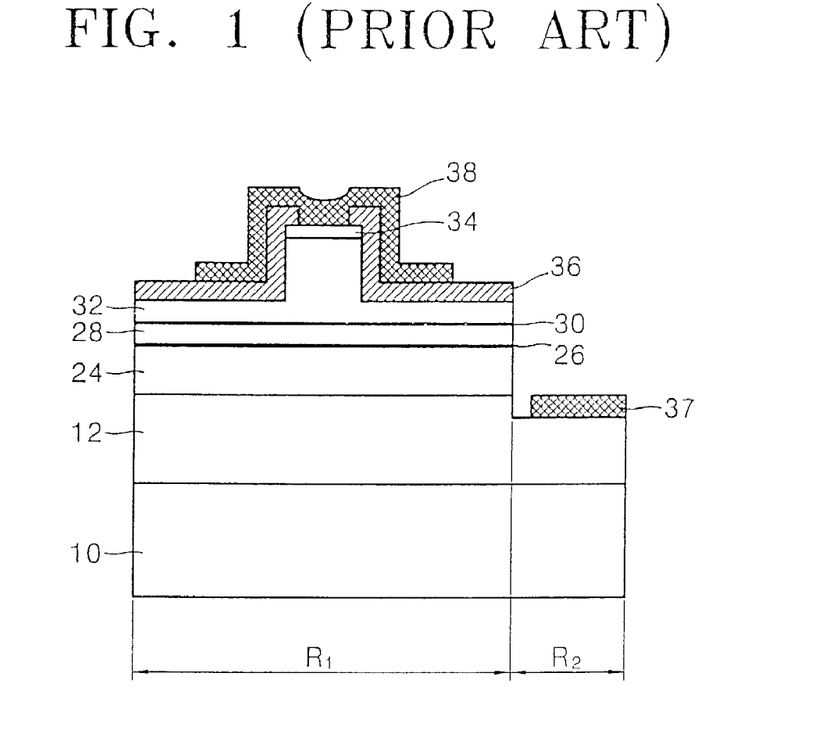
FIG. 1 is a cross-sectional view of a conventional semiconductor laser diode structure.

FIG. 1 is a cross-sectional view of a conventional semiconductor laser diode of a ridge wave guide structure, which is designed to reduce a critical current value for laser emission. Referring to FIG. 1, an n-GaN layer 12, which is defined by first and second regions R1 and R2, is deposited on a sapphire substrate 10. On the n-GaN layer 12 in the first region R1, an n-AlGaN/GaN layer 24, an n-GaN wave guide layer 26, an active layer 28, i.e., an InGaN layer, a p-GaN wave guide layer 30, and a p-AlGaN/GaN layer 32 are sequentially deposited. The indexes of refraction of the n-GaN wave guide layer 26 and p-GaN wave guide layer 30 are larger than those of refraction of the n-AlGaN/GaN layer 24 and the p-AlGaN/GaN layer 32 but are smaller than the index of refraction of the active layer 28. The p-AlGaN/GaN layer 32 has a ridge wave guide structure which is formed from the center of an upper portion of the p-AlGaN/GaN layer 32 that is projected. The sides of the projected center are vertical to peripheral portions and an upper portion thereof is a plane vertical to the sides.

The projected ridge wave guide structure of the p-AlGaN/GaN layer 32 confines an injected current to reduce a resonance region for laser emission in the active layer 28. A p-GaN layer 34 is deposited on the projected ridge wave guide of the p-AlGaN/GaN layer 32, and the entire surface of the p-AlGaN/GaN layer 32 is covered with a protective layer 36. Also, portions of the sides, except for a center portion, of the p-GaN layer 34 contacts the protective layer 36. A p-type electrode 38 is deposited on the protective layer 36 to contact the exposed surface of the p-GaN layer 34. The n-GaN layer 12 is more thinly formed in second region R2 than in the first region R1, and an n-type electrode 37 is deposited on the n-GaN layer 12 in the second region R2.

A conventional semiconductor laser diode has a ridge structure for confining a lot of the injected currents to reduce the width of resonance, thereby reducing a critical current value for laser emission compared to the existing semiconductor laser diode having no ridge structure.

Figure 2:
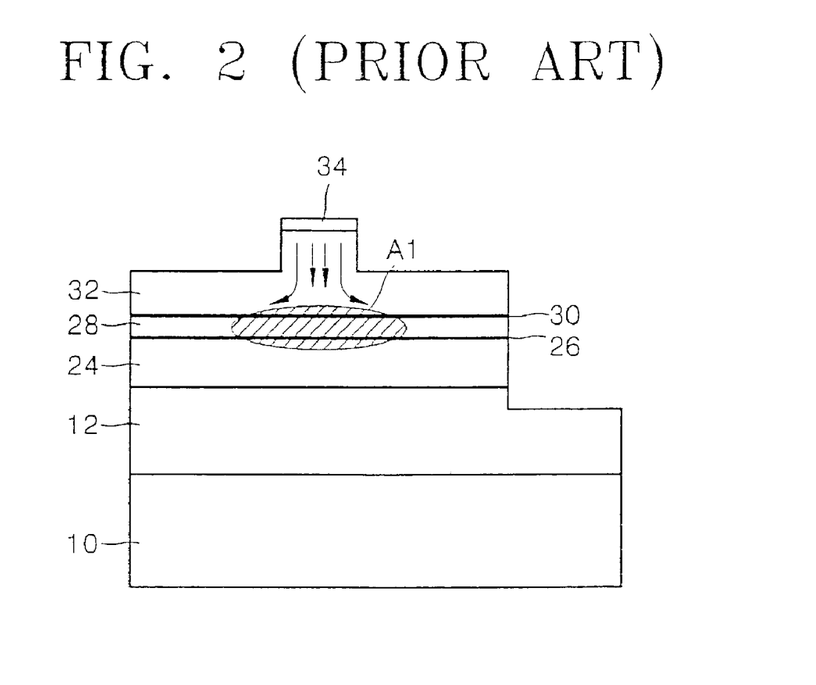
FIG. 2 is a cross-sectional view of a conventional semiconductor laser diode having a ridge of a shallow depth in which the width of resonance of a current is widened.

However, in case that a portion of a sapphire substrate is thinly etched to form a ridge portion, i.e., the height of the ridge is short as shown in FIG. 2, a corner of the ridge seldom obstructs an optical profile of the laser beam, thereby reducing an optical loss. This, however, fairly increases resistance in a p-AlGaN/GaN layer 32 and a p-GaN layer 34 and makes a current injected via the p-GaN layer 34 diffused more broadly than the width of the ridge before it reaches an active layer 28. As a result, the width of a resonance region A1 is broadened, which would increase a critical current value.

Figure 3:
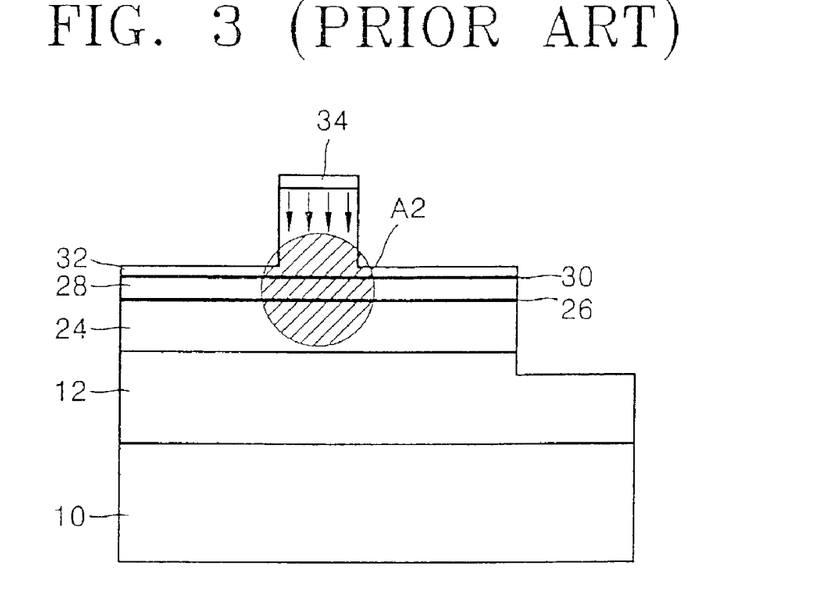
FIG. 3 is a cross-sectional view of a conventional semiconductor laser diode having a ridge of a deep depth in which an optical loss is caused.

Meanwhile, as shown in FIG. 3, a portion of a sapphire substrate is thickly etched, the height of the ridge is long, and a clad layer around the ridge has a thin thickness, diffusion of a current is prevented and a critical value for emission is reduced. As a result, the width of a resonance region A2 is reduced. However, an optical profile contacts the sides of the ridge, which would cause an optical loss.

SUMMARY OF THE INVENTION

The present invention provides a semiconductor laser diode of a ridge wave guide structure in which the width of a current intensity profile injected into an active layer is reduced and an optical profile does not contact the corners of the ridge wave guide structure.

According to an aspect of the present invention, there is provided a semiconductor laser diode comprising a substrate; a first material layer deposited on the substrate; an active layer which is deposited on the first material layer and emits a laser beam; and a second material layer which is deposited on the active layer and includes a ridge portion protruding from the active layer and a current confining layer formed by injection of ions into peripheral portions of the ridge portion so as to confine a current injected into the active layer.

The first material layer comprises a first compound semiconductor layer deposited on the substrate; a first clad layer deposited on the first compound semiconductor layer; and a first wave guide layer which is deposited on the first clad layer and has a larger index of refraction than the first clad layer.

It is preferable that the first compound semiconductor layer is an nGaN-based nitride semiconductor layer of an III-V group, and the first clad layer is an n-AlGaN/GaN layer.

It is preferable that the first wave guide layer has a smaller index of refraction than the active layer and is a GaN-based compound semiconductor layer of the III-V group.

The active layer may be a GaN-based nitride compound semiconductor layer of the III-V group which is an $In_xAl_yGa_{1-x-y}N$ layer ($0 \leq x \leq 1$, $0 \leq y \leq 1$ and $x+y \leq 1$).

The second material layer comprises: a second wave guide layer deposited on the active layer; a second clad layer which is deposited on the second wave guide layer, has smaller index of refraction than the second wave guide layer, and has the ridge portion; and a second compound semiconductor layer deposited on the ridge portion.

It is preferable that the second wave guide layer has a smaller index of refraction than the active layer and is a GaN-based compound semiconductor layer of the III-V group.

It is preferable that the second clad layer is a p-AlGaN/GaN layer and the second compound semiconductor layer is a pGaN-based nitride semiconductor layer of the III-V group.

The first compound semiconductor layer further comprises an n-type electrode on its upper portion.

It is preferable that the substrate is a sapphire substrate.

It is preferable that the semiconductor laser diode further includes a protective layer on the second clad layer and the second compound semiconductor layer, and further includes an electrode on the first compound semiconductor layer and the protective layer.

According to another aspect of the present invention, there is provided a method of fabricating a semiconductor laser diode, the method comprising sequentially forming a first material layer, an active layer, and a second material layer on a substrate, and etching a portion of the second material layer to make a ridge portion protrude from the second material layer; and forming a current confining layer by injecting ions into peripheral portions of the ridge portion of the second material layer so as to confine a current injected into the active layer.

It is preferable that when sequentially forming the first material layer, the active layer, and the second material layer and etching a portion of the second material layer, the ridge portion is formed by placing a mask on the second material layer and etching the second material layer to a depth within a range of not causing a lot loss in a laser beam, using ion beams.

During the forming of the current confining layer, the current confining layer is formed at peripheral portions of the ridge portion to a predetermined depth by placing the mask on the ridge portion and radiating ion beams on the peripheral portions of the ridge portion at a predetermined angle.

During the forming of the current confining layer, the ion beams are radiated at an inclined angle within a range of degree of 5–60, preferably, at degree of 15.

It is preferable that the first material layer is a structure in which a first compound semiconductor layer, a first clad layer, and a first wave guide layer are sequentially deposited on the substrate, the first wave guide layer having a larger index of refraction than the first clad layer.

It is preferable that the first compound semiconductor layer is an nGaN-based nitride semiconductor layer of an III-V group and the first clad layer is an n-AlGaN/GaN layer.

It is preferable that the first wave guide layer is formed of a material, e.g., a GaN-based compound semiconductor layer of the III-V group, which has a smaller index of refraction than the active layer.

It is preferable that the active layer is a GaN-based nitride compound semiconductor layer of the III-V group which is an $In_xAl_yGa_{1-x-y}N$ layer ($0 \leq x \leq 1$, $0 \leq y \leq 1$ and $x+y \leq 1$).

The second material layer is formed by sequentially depositing a second wave guide layer and a second clad layer on the active layer and depositing a second compound semiconductor layer on the ridge portion, the second clad layer having a smaller index of refraction than the second wave guide layer and being a beginning of the ridge portion.

It is preferable that when sequentially forming the first material layer, the active layer, and the second material layer and etching a portion of the second material layer, the ridge portion is formed by placing the mask on the second clad layer and etching the second clad layer to a depth within a range of not causing a lot loss in a laser beam, using ion beams.

During forming the current confining layer, the ridge portion is formed to a predetermined depth by placing the mask on the second clad layer and radiating ion beams on the second clad layer at a predetermined angle.

During the forming of the current confining layer, the ion beams are radiated at an inclined angle within a range of degree of 5–60, preferably, at degree of 15.

It is preferable that the second clad layer is a p-AlGaN/GaN layer and the second compound semiconductor layer is a p-GaN-based nitride compound semiconductor layer of the III-V group.

It is preferable that the first compound semiconductor layer has an n-type electrode at its upper portion and the substrate is a sapphire substrate.

It is preferable that a protective layer is further deposited on the second compound semiconductor layer and the second clad layer.

It is preferable that a p-type electrode is further deposited on the first compound semiconductor layer and the protective layer.

It is preferable that the second wave guide layer is formed of a material, e.g., a GaN-based compound semiconductor layer of the III-V group, which has a smaller index of refraction than the active layer.

As described above, in a semiconductor laser diode and a fabrication method thereof according to the present invention, a current confining layer is formed by injection of ions into the peripheral portions of a ridge portion. Therefore, optical loss can be reduced while maintaining optical profile. Also, the profile width of a current is reduced to lower resonance critical current, thereby reducing the size of a near field pattern and improving the performance of the semiconductor laser diode.

BRIEF DESCRIPTION OF THE DRAWINGS

The above object and advantages of the present invention will become more apparent by describing in detail preferred embodiments thereof with reference to the attached drawings in which:

FIG. 6A(a) through (c) are a diagram of the structure of a conventional semiconductor laser diode, a photograph of the mode of the near field pattern of a current injected into the semiconductor laser diode of (a), and a graph of the current intensity profile of the semiconductor laser diode of (a), respectively; and FIG. 6B(a) through (c) are a diagram of the structure of a semiconductor laser diode according to the present invention, a photograph of the mode of the near field pattern of a current injected into the semiconductor laser diode of (a), and a graph of the current intensity profile of the semiconductor laser diode of (a), respectively.

DETAILED DESCRIPTION OF THE INVENTION

Hereinafter, a semiconductor laser diode having a current confining layer and a fabrication method thereof are described in detail with reference to the accompanying drawings. For clarity, the width and height of each layer of the semiconductor laser diode is exaggerated.

Figure 4:
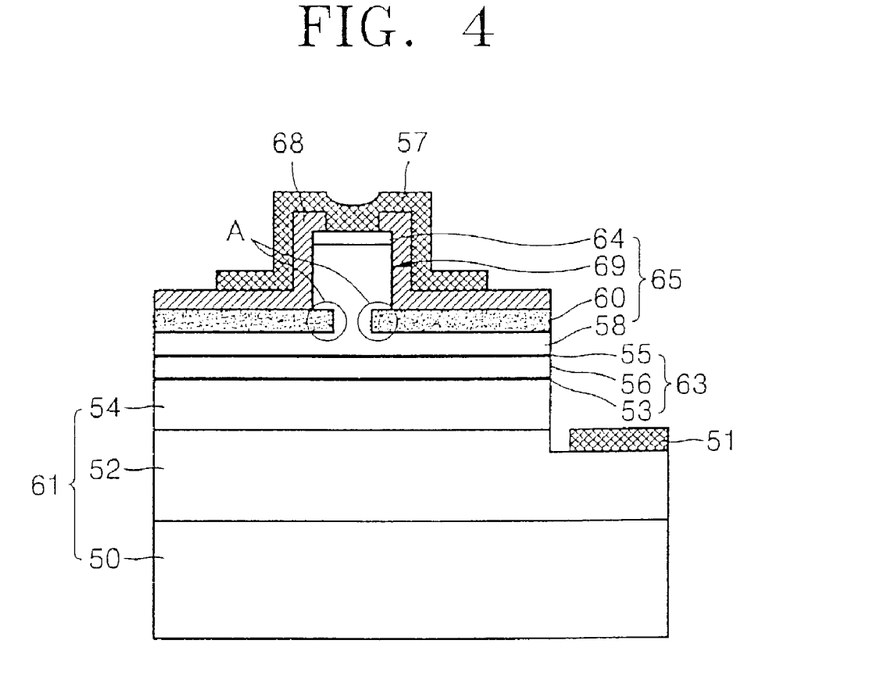
FIG. 4 is a cross-sectional view of a semiconductor laser diode according to the present invention.

FIG. 4 is a cross-sectional view of a semiconductor laser diode. Referring to FIG. 4, the semiconductor laser diode includes a substrate 50, and includes a first material layer 61, an active layer 56, and a second material layer 63 which are sequentially deposited on the substrate 50.

The first material layer 61 is deposited on the substrate 50 and includes a first compound semiconductor layer 52 having a step, a first clad layer 54 deposited on the first compound semiconductor layer 52, and a first wave guide layer 53 deposited on the first clad layer 54. An n-type electrode 51 is formed at the step of the first compound semiconductor layer 52.

In general, the substrate 50 is a sapphire substrate of high resistivity. The first compound semiconductor layer 52 is formed of a GaN-based nitride compound semiconductor layer of an III-V group, more preferably, an n-GaN layer. However, a material for the first compound semiconductor 52 is not restricted to the above compound, for example, it may be a compound semiconductor layer formed of a different material from the III-V group capable of lasing. Preferably, the first clad layer 54 is an n-AlGaN/GaN layer with predetermined index of refraction but may be another kind of a compound semiconductor layer capable of lasing.

The first wave guide layer 53 is formed of a material whose index of refraction is smaller than that of the active layer 56, preferably, a GaN-based compound semiconductor layer of the III-V group. The active layer 56 may be formed of any material layer capable of lasing, preferably, a material layer having a low critical current value and capable of emitting a laser beam of a stable cross mode. Also, preferably, the active layer 56 is $In_xAl_yGa_{1-x-y}N$ containing a predetermined amount of Al ($0 \leq x \leq 1$, $0 \leq y \leq 1$ and $x+y \leq 1$) that is a GaN-based nitride semiconductor layer of the III-V group.

A second material layer 65 is deposited on a second wave guide layer 55 and has a projected ridge portion 69 at its center. The second material layer 65 includes a second wave guide layer 55 deposited on the active layer 56, a second clad layer 58 whose index of refraction is smaller than that of the second wave guide layer 55, and a second compound semiconductor layer 64 deposited on the ridge portion 69. The first and second wave guide layers 53 and 55 are formed of an n-GaN layer and a p-GaN layer, respectively. The second clad layer 58 is formed of a p-type compound semiconductor layer when the first clad layer 54 is an n-type compound semiconductor layer and formed of an n-type compound semiconductor layer when the first clad layer 54 is a p-type compound semiconductor layer. For instance, if the first clad layer 54 is an n-AlGaN/GaN layer, the second clad layer 58 is formed of a p-AlGaN/GaN layer. Similarly, when the first compound semiconductor layer 64 is an n-type compound semiconductor layer, the second compound semiconductor layer 64 is formed of a p-type compound semiconductor layer and the reverse is also possible. For instance, if the first compound semiconductor layer 52 is formed of an n-GaN layer, the second compound semiconductor layer 64 is formed of a p-GaN layer.

A semiconductor laser diode according to a preferred embodiment of the present invention includes a current confining layer 60 of a predetermined thickness formed around the ridge portion 69. The current confining layer 60 is obtained by radiating ion beams on the surface of the second clad layer 58 around the ridge portion 69 of the second clad layer 58 at a predetermined angle. The current confining layer 60 has the same index of refraction as the second compound semiconductor layer 64 but has larger resistance than the second compound semiconductor layer 64, thereby independently controlling a current intensity profile while constantly maintaining a optical profile.

As described above with respect to a conventional semiconductor laser diode, the ridge portion 69 must have a deep depth to reduce a loss in a current intensity profile but must have a shallow depth to reduce a loss in an optical profile. To solve this contradiction, a semiconductor laser diode according to the present invention further includes the current confining layer 60 to change the properties of the second compound semiconductor layer 64 deposited on the ridge portion 64 while maintaining the physical depth of the ridge portion 69, thereby spatially separating the ridge portion 69 from the peripheral portions thereof. This is based on the fact that an optical profile and a current intensity profile are affected by the index of refraction and the resistivity of a substance, respectively.

The ridge portion 69 projects vertically to the surface of the active layer 56. Ions are injected to a predetermined depth into from the surface of the second clad layer 58 around the ridge portion 69 to the bottom of the ridge portion 69 in the horizontal direction of the active layer 56, thereby forming the current confining layer 60. Circles indicated with 'A' in FIG. 4 are penetration regions through which the width of a current intensity profile passing through the ridge portion 69 are considerably reduced to lower a critical current and prevent optical loss. In the preferred embodiment of the present invention, an ion shower method is used to inject ions into the second clad layer 58, which will be later described in detail with reference to FIGS. 5A and 5B. The depth of the current confining layer 60 is formed to more shallow than the thickness of the second clad layer 58. For example, preferably, the widths of the penetration regions A are formed to 0.5 μm if the width of the ridge portion 69 is about 2 μm.

Further, a protective layer 68 may be deposited on the second clad layer 58 and the second compound semiconductor layer 64, and a p-type electrode 57 may be deposited on the protective layer 68 and a portion of the surface of the second compound semiconductor layer 64 which is not covered with the protective layer 68. Also, the n-type electrode 51 is deposited on the step of the first compound semiconductor layer 52 in the present invention but may be formed at a low portion of the substrate 50 to face the p-type electrode 69. In this case, it is preferable that the substrate 50 is formed of silicon carbon (SiC) or gallium nitride (GaN).

FIGS. 5A through 5E are cross-sectional views of a semiconductor laser diode illustrating a method of fabricating a semiconductor laser diode according to the present invention.

Figure 5A:
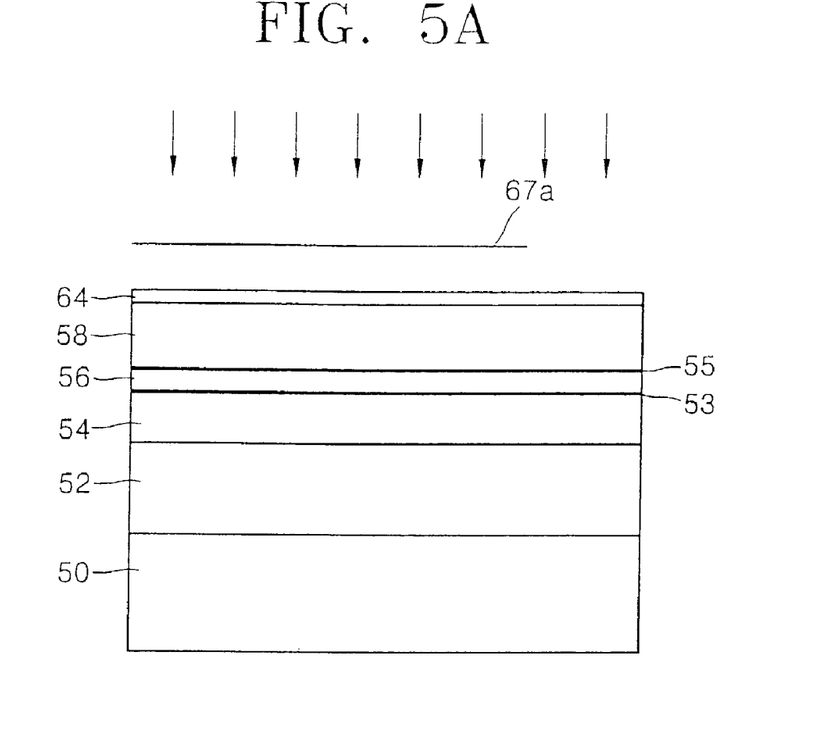
FIGS. 5A through 5E are cross-sectional views of a semiconductor laser diode illustrating a method of fabricating a semiconductor laser diode according to the present invention.
Figure 5B:
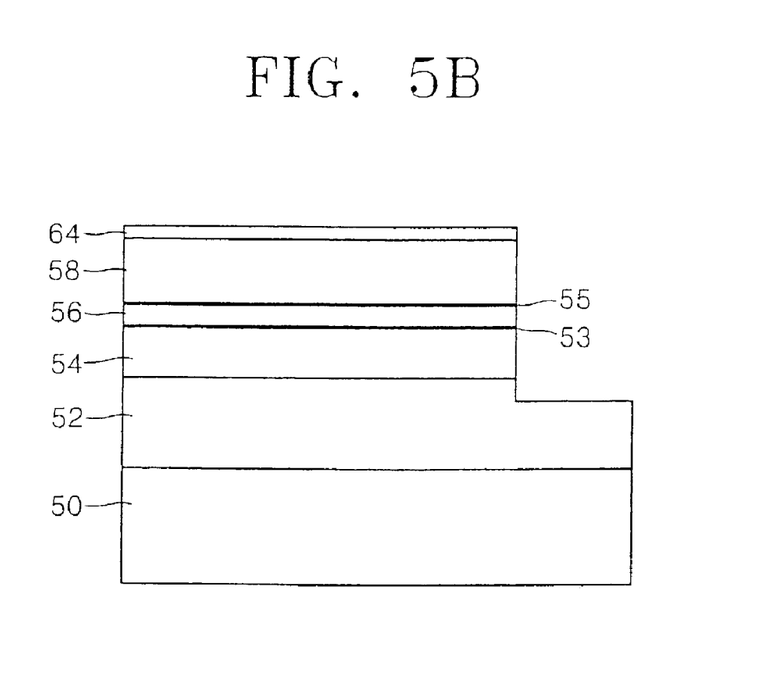
Figure 5C:
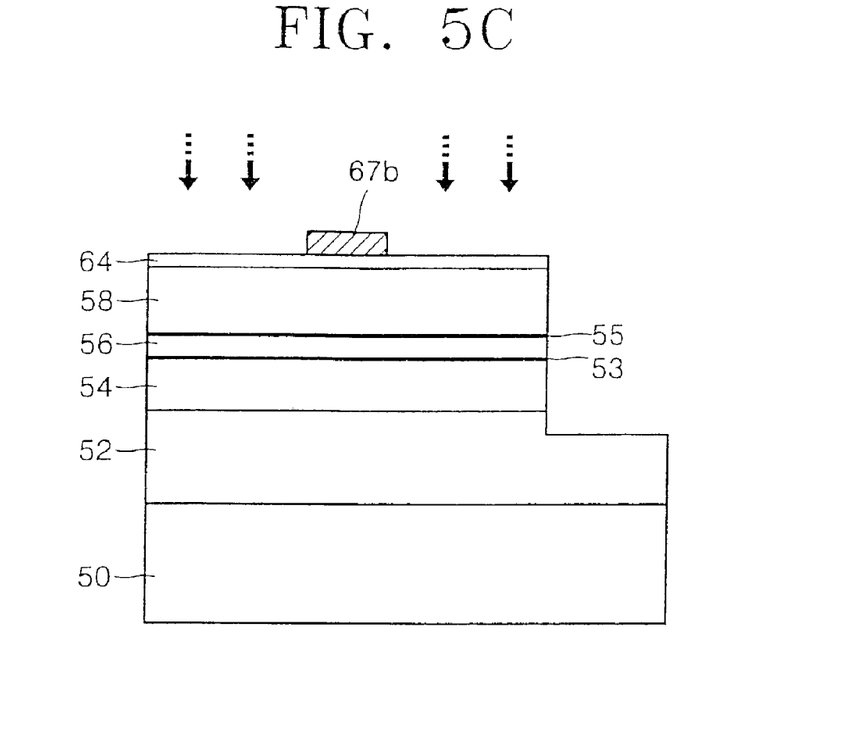
Figure 5D:
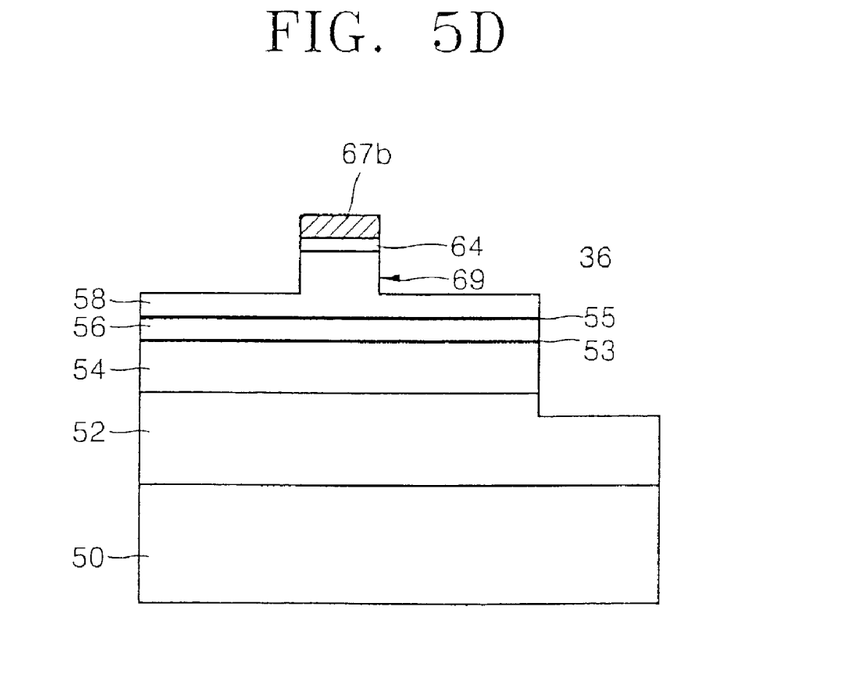

First, as shown in FIG. 5A, a first compound semiconductor layer 52, a first clad layer 54, a first wave guide layer 53, an active layer 56, a second wave guide layer 55, and a second clad layer 58 are sequentially deposited on a substrate 50. Next, a mask 67a is positioned on the resultant structure, and an exposure process, a development process, and an etching process are sequentially deposited on the resultant structure, thereby patterning the resultant structure as shown in FIG. 5B. Thereafter, a mask 67b is placed only on the second clad layer 58 as shown in FIG. 5C, and the resultant structure is etched with ion beams. As a result, a ridge portion 69 is formed to protrude from the center portion of the second clad layer 58 in the vertical direction of the surface of the active layer 56, as shown in FIG. 5D.

Figure 5E:
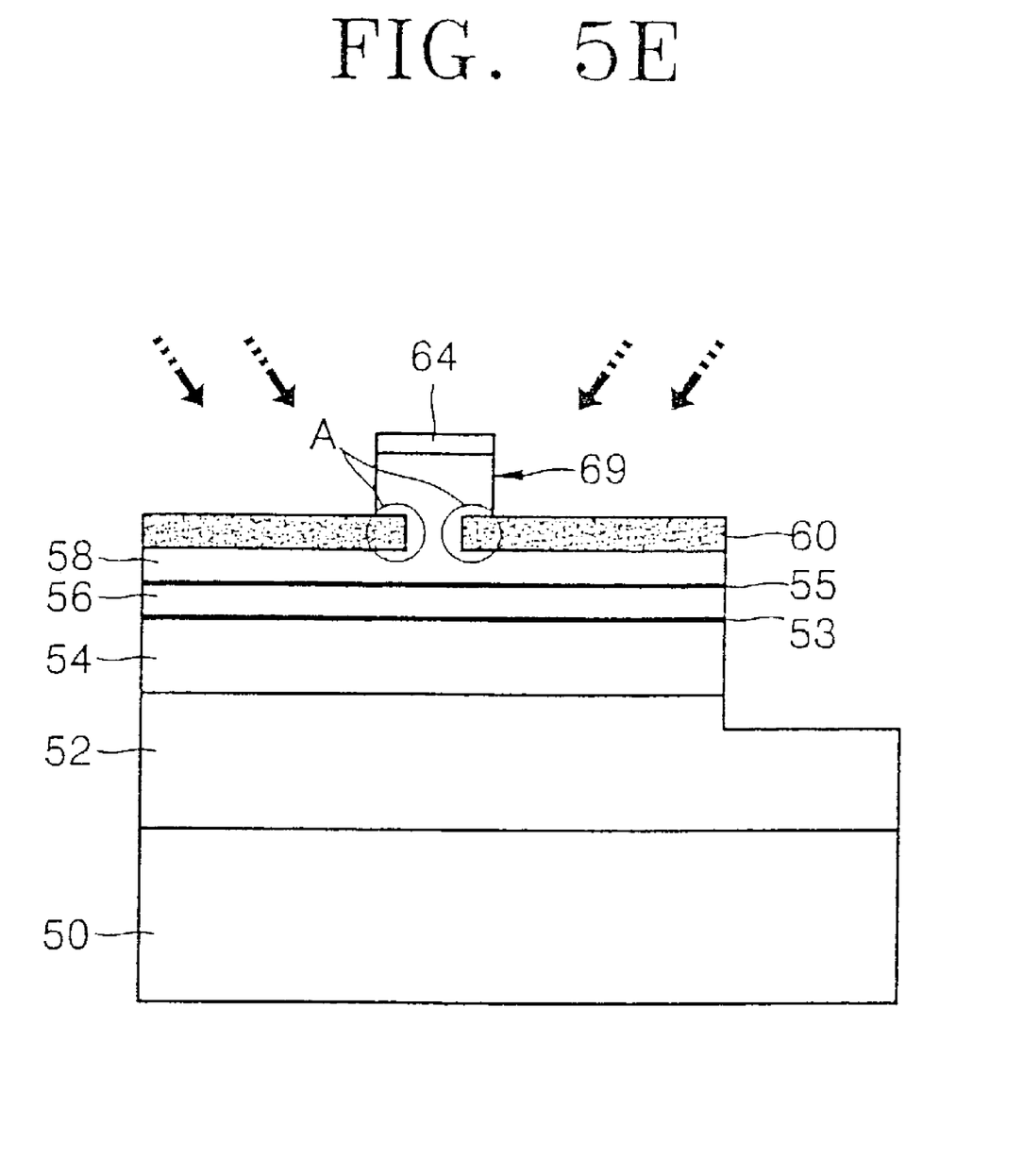

Referring to FIG. 5E, the mask 67b is also placed on the ridge portion 69 and ion beams are incident on the surface of the second clad layer 58 over the mask 67b at a predetermined angle so as to radiate the ion beams on peripheral portions and the inside of the bottom of the ridge portion 69 to a predetermined depth. As a result, ions are penetrated into the surface of the second clad layer 58 around the ridge portion 69, not into the portions of the ridge portion that are covered with the mask 67b, thereby forming a current confining layer 60. The inclination angle of each ion beam may fall within a range from about 5° to about 60°, but preferably, about 15°. It is possible to adjust the width of current confining regions A, which are formed inside of the lower portion of the ridge portion 69, by changing the inclination angle according to the width of the ridge portion 69. The inclination angle can be changed by controlling an etching apparatus or the position of a wafer stage.

The current confining layer 60 is formed by penetrating ions from a starting point of the ridge portion 69 to the bottom surface parallel to the surface of the active layer 56. By this way, it is possible to substantially reduce a passage into which a current is injected while maintaining the physical width of the ridge portion 69.

An ion shower method injects ions into an object with a low energy of several hundred eV unlike a general ion injection method. For this reason, ions are thinly injected into the ridge portion 69 but the injected ions are diffused over the bottom surface of the ridge portion 69. Therefore, the ion shower method is preferred when forming the current confining layer 60. Also, the ion shower method can be used in injecting ions into the substrate 50 having a predetermined inclined angle, which makes it possible to effectively broaden the width of the current confining layer 60 to reach the inside of the bottom of the ridge portion 69. Effective ion injection makes ions penetrate into a half of the width of the bottom surface of the ridge portion 69 to form the current confining layer 60.

Figure 6A:
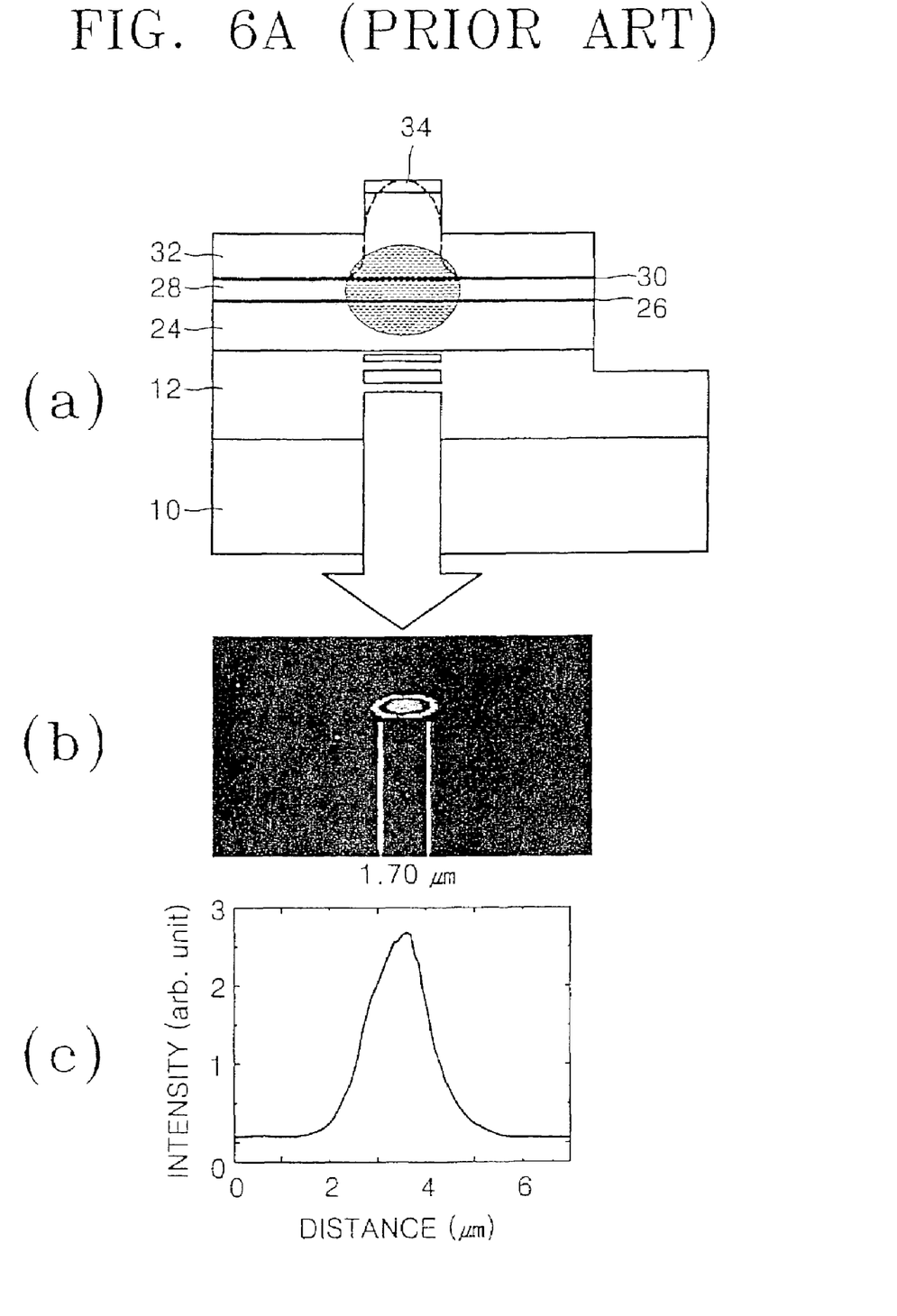
Figure 6B:
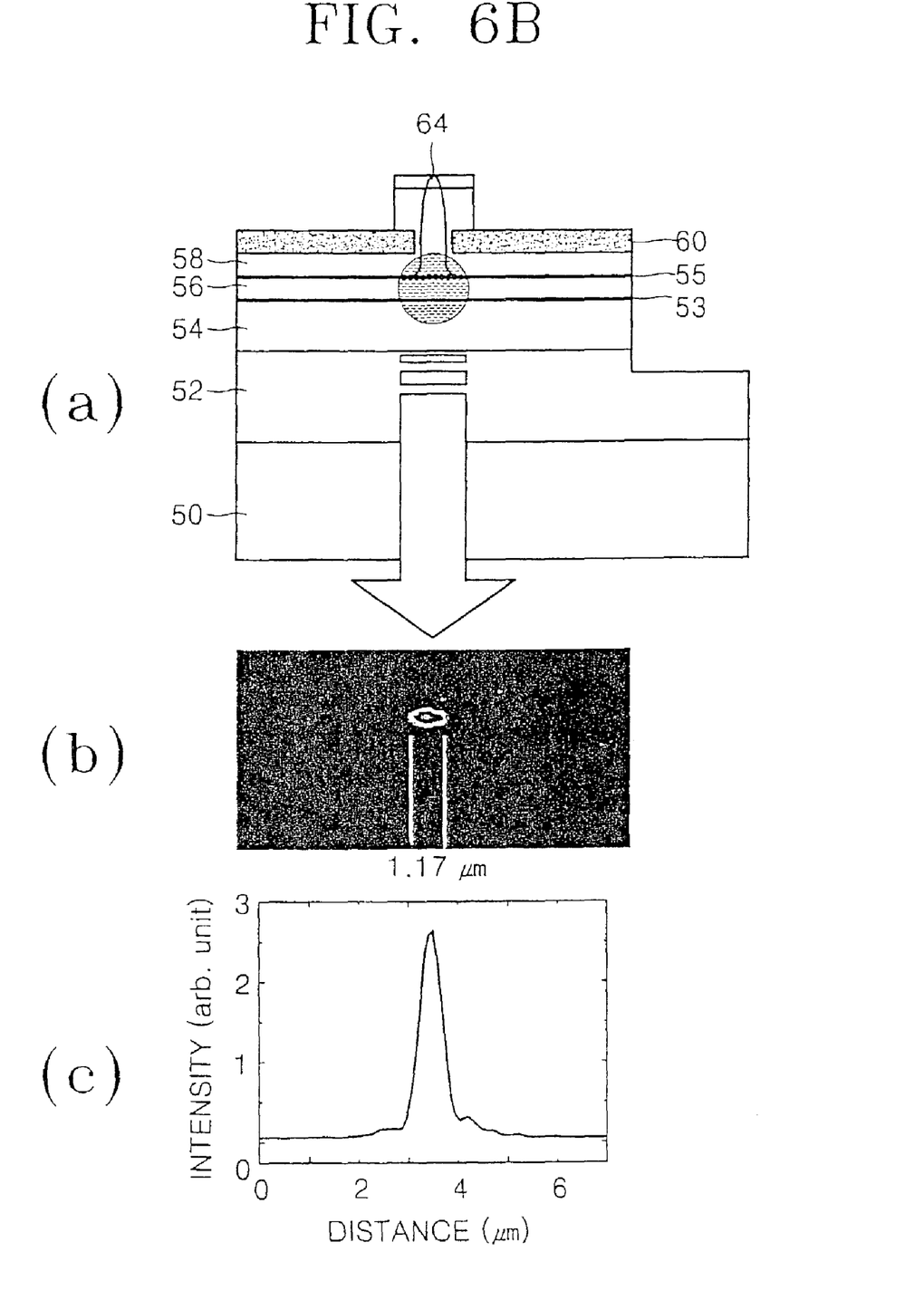

FIG. 6A(a) through (c) are a diagram of the structure of a conventional semiconductor laser diode, a photograph of the mode of the near field pattern of a current injected into the semiconductor laser diode of (a), and a graph of the current intensity profile of the semiconductor laser diode of (a), respectively. In FIG. 6A(a), reference numerals are the same as those for components of a conventional semiconductor laser diode which is described with reference to FIGS. 2 ad 3.

FIG. 6B(a) through (c) are a diagram of the structure of a semiconductor laser diode according to the present invention, a photograph of the mode of the near field pattern of a current injected into the semiconductor laser diode of (a), and a graph of the current intensity profile of the semiconductor laser diode of (a), respectively. In FIG. 6B(a), reference numerals are the same as those for elements of a semiconductor laser diode, according to the present invention, which is described with reference to FIG. 4.

Referring to FIG. 6B(a), to form a current confining layer 60 of a semiconductor laser diode according to a preferred embodiment of the present invention, the ion shower method is performed under conditions that an ion beam voltage is 700 V, an ion beam current is about 400 mA, an inclined angle of a substrate 50 is degree of 15, time of ion shower is 60 seconds, and oxygen is used as a gas in forming ions.

Upon comparing the structures illustrated in FIGS. 6A(a) and 6B(a), a semiconductor laser diode of FIG. 6B(a) according to a preferred embodiment of the present invention further includes the current confining layer 60 on a second compound semiconductor layer 58 around the starting point of a ridge portion. In a conventional semiconductor laser diode structure of FIG. 6A(a), a current injected via a ridge portion reaches the current reaches an active layer 28 with its width being not reduced. However, in a semiconductor laser diode according to the present invention, the width of a current passing through a ridge portion 69 is reduced due to the current confining layer 60 and reaches an active layer 54 as shown in FIG. 6B (a).

Referring to FIG. 6A(b) and FIG. 6B(b), the mode of the near field of a conventional semiconductor laser diode, i.e., a current intensity profile, has a width of 1.70 µm, and that of a semiconductor laser diode, i.e., a current intensity profile, according to the present invention has a width of 1.17 µm. This reveals that the width of the current intensity profile of a current injected into a semiconductor laser diode according to the present invention is still narrower than that of the current intensity profile of a current injected into a conventional semiconductor laser diode, which is also illustrated in the graphs of FIG. 6A(c) and FIG. 6B(c). Therefore, the amount of a current injected into a semiconductor laser diode according to the present invention decreases, and a critical current value also decreases. In this case, the width of the ridge portion 69 is, however, the same as that of a ridge portion of the conventional semiconductor laser diode, and therefore, an optical loss is not caused.

In a semiconductor laser diode and a fabrication method thereof according to the present invention, an optical loss is reduced using a ridge wave guide of a shallow depth and the profile width of a current injected via the ridge wave guide is also reduced with a current confining layer which is made by injecting ions into peripheral portions of the starting point of the ridge wave guide, thereby reducing the width of a laser beam emitting at an active layer. A reduction in the width of the laser beam results in a reduction in the size of the mode of the near field and an emitting critical current. By this way, it is possible to fabricate a semiconductor laser diode whose performance is better than a conventional semiconductor laser diode.

While this invention has been particularly shown and described with reference to preferred embodiments thereof, it will be understood by those skilled in the art that various changes in form and details may be made therein without departing from the spirit and scope of the invention as defined by the appended claims.

As described above, a semiconductor laser diode and a fabrication method thereof according to the present invention is advantageous in that the profile width of a current injected into an active layer can be reduced with a shallow ridge portion due to a current confining layer which is obtained by injection of ions into peripheral portions of the ridge portion. As a result, a semiconductor laser diode having a low-emitting critical current and improved performance can be fabricated.

What is claimed is:

1. A semiconductor laser diode comprising:
   a substrate;
   a first material layer deposited on the substrate;

an active layer which is deposited on the first material layer and emits a laser beam; and a second material layer which is deposited on the active layer and includes a ridge portion protruding perpendicularly to the active layer and a current confining layer formed by injection of ions into a half of a width of a bottom surface of the ridge portion so as to confine a current injected into the active layer.

2. The semiconductor laser diode of claim 1, wherein the first material layer comprises:
   a first compound semiconductor layer deposited on the substrate;
   a first clad layer deposited on the first compound semiconductor layer; and
   a first wave guide layer which is deposited on the first clad layer and has a larger index of refraction than the first clad layer.

3. The semiconductor laser diode of claim 2, wherein the first compound semiconductor layer is an n-GaN -based nitride semiconductor layer of an III-V group.

4. The semiconductor laser diode of claim 2, wherein the first clad layer is an n-AlGaN/GaN layer.

5. The semiconductor laser diode of claim 2, wherein the index of refraction of the first wave guide layer is smaller than that of the active layer.

6. The semiconductor laser diode of claim 2, wherein the first wave guide layer is a GaN-based compound semiconductor layer of the III-V group.

7. The semiconductor laser diode of claim 2, wherein the first compound semiconductor layer further comprises an n-type electrode on its upper portion.

8. The semiconductor laser diode of claim 1, wherein the active layer is a GaN-based nitride compound semiconductor layer of the III-V group which is an $In_xAl_yGa_{1-x-y}N$ layer ($0 \leq x \leq 1$, $0 \leq y \leq 1$ and $x+y \leq 1$).

9. The semiconductor laser diode of claim 1, wherein the second material layer comprises:
   a second wave guide layer deposited on the active layer;
   a second clad layer which is deposited on the second wave guide layer, has smaller index of refraction than the second wave guide layer, and has the ridge portion; and
   a second compound semiconductor layer deposited on the ridge portion.

10. The semiconductor laser diode of claim 9, wherein the second wave guide layer has a smaller index of refraction than the active layer.

11. The semiconductor laser diode of claim 9, wherein the second wave guide layer is a GaN-based compound semiconductor layer of the III-V group.

12. The semiconductor laser diode of claim 9, the second clad layer is a p-AlGaN/GaN layer.

13. The semiconductor laser diode of claim 9, wherein the second compound semiconductor layer is a p-GaN-based nitride semiconductor layer of the III-V group.

14. The semiconductor laser diode of claim 9, further comprising a protective layer on the second clad layer and the second compound semiconductor layer.

15. The semiconductor laser diode of claim 14, further comprising an electrode on the first compound semiconductor layer and the protective layer.

16. The semiconductor laser diode of claim 1, wherein the substrate is a sapphire substrate.

17. A semiconductor laser diode comprising:
   a substrate;
   a first material layer deposited on the substrate;
   an active layer which is deposited on the first material layer and emits a laser beam; and
   a second material layer which is deposited on the active layer and includes a homogenous portion of a ridge portion protruding perpendicularly from the active layer and a current confining layer formed in a half of a width of a bottom surface of the homogeneous ridge portion so as to confine a current injected into the active layer.

18. The semiconductor laser diode of claim 17, wherein the first material layer comprises:
   a first compound semiconductor layer deposited on the substrate;
   a first clad layer deposited on the first compound semiconductor layer; and
   a first wave guide layer which is deposited on the first clad layer and has a larger index of refraction than the first clad layer.

19. The semiconductor laser diode of claim 18, wherein the first compound semiconductor layer is an n-GaN-based nitride semiconductor layer of an III-V group.

20. The semiconductor laser diode of claim 18, wherein the first clad layer is an n-AlGaN/GaN layer.

21. The semiconductor laser diode of claim 18, wherein the index of refraction of the first wave guide layer is smaller than that of the active layer.

22. The semiconductor laser diode of claim 18, wherein the first wave guide layer is a GaN-based compound semiconductor layer of the III-V group.

23. The semiconductor laser diode of claim 17, wherein the active layer is a GaN-based nitride compound semiconductor layer of the III-V group which is an $In_xAl_yGa_{1-x-y}N$ layer ($0 \leq x \leq 1$, $0 \leq y \leq 1$ and $x+y \leq 1$).

24. The semiconductor laser diode of claim 17, wherein the second material layer comprises:
   a second wave guide layer deposited on the active layer;
   a second clad layer which is deposited on the second wave guide layer, has smaller index of refraction than the second wave guide layer, and has the ridge portion; and
   a second compound semiconductor layer deposited on the ridge portion.

25. The semiconductor laser diode of claim 24, wherein the second wave guide layer has a smaller index of refraction than the active layer.

26. The semiconductor laser diode of claim 24, wherein the second wave guide layer is a GaN-based compound semiconductor layer of the III-V group.

27. The semiconductor laser diode of claim 24, the second clad layer is a p-AlGaN/GaN layer.

28. The semiconductor laser diode of claim 24, wherein the second compound semiconductor layer is a p-GaN-based nitride semiconductor layer of the III-V group.

29. The semiconductor laser diode of claim 24, further comprising a protective layer on the second clad layer and the second compound semiconductor layer.

30. The semiconductor laser diode of claim 29, further comprising an electrode on the first compound semiconductor layer and the protective layer.

31. The semiconductor laser diode of claim 18, wherein the first compound semiconductor layer further comprises an n-type electrode on its upper portion.

32. The semiconductor laser diode of claim 17, wherein the substrate is a sapphire substrate.

* * * * *